(12) United States Patent
Leonardi et al.

(10) Patent No.: US 6,888,213 B2
(45) Date of Patent: May 3, 2005

(54) DIELECTRIC INSULATION STRUCTURE FOR INTEGRATING ELECTRONIC SEMICONDUCTOR DEVICES AND RELEVANT MANUFACTURING PROCESS

(75) Inventors: Salvatore Leonardi, Aci-S. Antonio (IT); Roberto Modica, Catania (IT); Giuseppe Arena, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/444,102

(22) Filed: May 22, 2003

(65) Prior Publication Data

US 2004/0026761 A1 Feb. 12, 2004

(30) Foreign Application Priority Data

May 22, 2002 (IT) ...................................... MI2002A1099

(51) Int. Cl.$^7$ .............................................. H01L 29/06
(52) U.S. Cl. ........................ 257/506; 257/501; 257/513; 257/522; 257/524

(58) Field of Search .................................. 257/506, 501, 257/513, 522, 524, 525

(56) References Cited

U.S. PATENT DOCUMENTS 5,227,658 A * 7/1993 Beyer et al. ................. 257/522
6,191,467 B1 * 2/2001 Park et al. .................... 257/522

* cited by examiner

*Primary Examiner*—Jerome Jackson
(74) *Attorney, Agent, or Firm*—Lisa K. Jorgenson; Allen, Dyer, Doppelt, Milbrath & Gilchrist, P.A.

(57) ABSTRACT

A dielectric insulation structure is formed in a silicon layer by integrating a dielectric trench structure therein. The dielectric trench structure defines an insulation well where semiconductor devices are to be integrated therein. The dielectric trench structure is on a hollow region that is completely surrounded by a dielectric area. The dielectric area also forms the side insulation of the dielectric trench structure. The dielectric trench structure is interrupted by a plurality of points to define a plurality of side support regions for the insulation well.

14 Claims, 5 Drawing Sheets

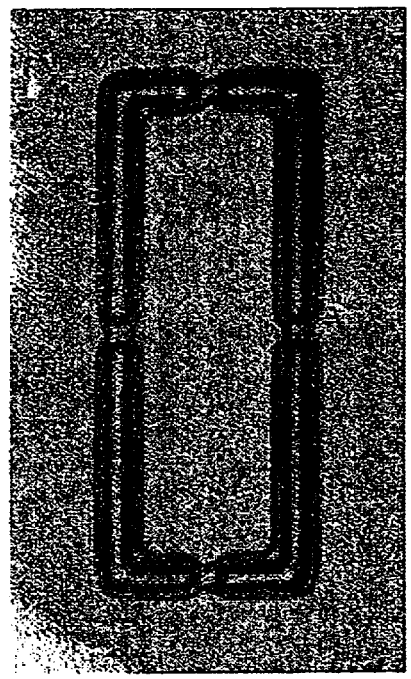
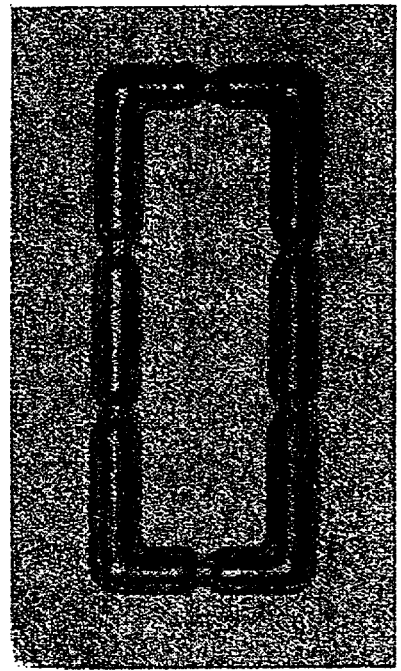
FIG. 4A             FIG. 4B
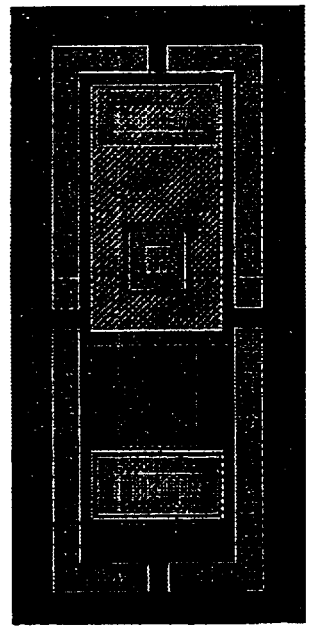
FIG. 5A

DIELECTRIC INSULATION STRUCTURE FOR INTEGRATING ELECTRONIC SEMICONDUCTOR DEVICES AND RELEVANT MANUFACTURING PROCESS

FIELD OF THE INVENTION

The present invention relates to a dielectric insulation structure for integrating electronic semiconductor devices therein, and a corresponding manufacturing process. The present invention relates particularly, but not exclusively, to a dielectric insulation structure formed through traditional integration processes, and the following description is made with reference to this field of application for convenience of illustration only.

BACKGROUND OF THE INVENTION

As well known by those skilled in the art, complete dielectric insulation between one or more electronic semiconductor devices can be obtained by using dielectric trenches integrated on silicon-on-insulator SOI substrates, thus forming dielectrically insulated wells for integrating these devices therein.

In particular, SOI substrates comprise a buried oxide layer BOX for forming the vertical insulation of the dielectrically insulated well, with dielectric trenches forming the side insulation thereof. The continuity between the buried oxide layer (vertical insulation) and dielectric trenches (side insulation) ensures a complete dielectric insulation of the wells, and thus the devices integrated therein.

With reference to FIG. 1, an integrated structure 1 comprising a dielectrically insulated well 2 formed according to known criteria will now be described. In particular, the integrated structure 1 comprises a substrate 3 whereon a buried oxide layer BOX 4 is formed. The BOX 4 forms the horizontal dielectric insulation of the dielectrically insulated well 2. In particular, the dielectrically insulated well 2 is formed in a silicon layer 5, defined as silicon-on-insulator or SOI, by dielectric trenches 6 that form a side insulation region 7 of the dielectrically insulated well 2. The dielectric trenches 6 also define a horizontal insulation region 8 corresponding to the buried oxide layer BOX 4 area between the dielectric trenches 6.

Side and horizontal insulation regions 7 and 8 define an inner integration area 9 wherein several types of components can be integrated. These components are to be insulated. The substrate 3 serves as a mechanical support during the manufacturing steps of the components to be integrated in the dielectrically insulated well 2.

This type of integrated structure, though advantageous with respect to the insulation of devices for low power applications, does not allow vertical-current-flow power devices, i.e., those devices having conduction paths starting from the surface of the integrated structure 1 and reaching the substrate 3, to be integrated because of the presence of the buried oxide layer 4. The buried oxide layer 4 prevents these conduction paths from being created.

Moreover, technologies for integrating electronic devices using this type of dielectrically insulated wells are more expensive than technologies for integrating electronic devices on traditional substrates because of the high production cost of an SOI substrate. Other types of dielectric insulation structures are also known, which can be formed at low production costs and which can have vertical-current-flow power devices integrated therein. An integrated structure is described, for example, in European Patent Application No. 1,043,769, which was published on Nov. 10, 2000, and is assigned to the current assignee of the present invention.

In particular, this European patent application describes a dielectric insulation structure formed by chemical etching of silicon regions to conveniently empty these regions, and obtain a structure 10 of the type shown in FIGS. 2A to 2D. With reference to FIG. 2A, the structure 10 is formed in a silicon layer 11, and comprises a dielectric trench structure 12 connected to a dielectric area 13 surrounding first and second hollow regions 14, 15. The dielectric trench structure 12 and the dielectric area 13 also define. an insulation well 16, wherein several types of electronic components can be integrated therein.

The insulation well 16 is obtained by forming at first the dielectric trench structure 12, and afterwards, hollow regions 14 and 15. In particular, the dielectric trenches 12 are formed through dry anisotropic etching according to known criteria, while the hollow regions 14 and 15 are obtained through dry or acid-solution isotropic etching. During the formation of the hollow regions 14 and 15, the walls of the dielectric trenches 12 are protected with dielectric material which is selective to silicon etching when forming the hollow regions. Afterwards, an oxidation process allows the hollow regions 14 and 15 to be dielectrically insulated, which forms the dielectric area 13, and thus the insulation well 16. A deposition process of a not very conductive material allows structure 12 to have dielectric trenches that are filled, and depending on the depth of the trench, the hallow regions 14 and 15 may also be filled.

A surface planarizing step completes formation of the structure 10. The structure 10 thus comprises an insulation well 16 dielectrically insulated from the residual silicon making up the structure 10, and wherein it is possible to integrate elementary components, and vertical conduction silicon regions such as the region 17.

It is thus possible, by using the prior art structure 10, to integrate insulation wells in a dedicated way, while keeping on the same chip regions for integrating power devices. Moreover, the structure 10 comprising the insulation well 16 has been obtained by using traditional, low-cost integration processes.

Though advantageous under many aspects, the above described structure 20 has structural problems concerning the three-dimensional construction of the insulation well 16. In particular, during the formation of the hollow regions 14 and 15, the silicon portion forming the insulation well 16 must be mechanically supported to prevent it from breaking down.

FIGS. 2B, 2C and 2D schematically show supporting techniques of the insulation well 16 to be used to form the prior art structure 10. In particular, FIGS. 2B and 2C show mechanical supports 18 and 20 along a cross-dimensional view of the structure 10, while FIG. 2D shows a vertical mechanical support 23 starting from the bulk region of the structure 10.

In particular, the mechanical transversal support 18 of FIG. 2B for the insulation well 16 comprises an oxide region 19 serving as a side support of the insulation well 16. Actually, the approach shown in FIG. 2B does not allow a complete dielectric insulation because of the limited depth that can be obtained with the oxide region 19 of the mechanical transversal support 18 with respect to the dielectric trenches 12.

To remove this drawback, FIG. 2C shows a mechanical transversal support 20 comprising an oxide region 21 transversal to the structure 10, and an additional dielectric trench 22 integrated in a cross-direction of the structure 10. In this case, a complete dielectric insulation is obtained, but a double trench integration is introduced. Further process steps are thus required (particularly the addition of photomasking, etching, oxidizing, filling and planarizing steps), which make the process sequence more complicated.

It is also possible to obtain a complete dielectric insulation of the insulation well 16 by etching to form the hollow regions 14 and 15 while leaving therebetween a region that is a thin silicon portion 24 which serves also as a vertical mechanical support 23 of the insulation well 16. The silicon portion 24 must necessarily be sufficiently thin so that an oxidizing step to form the dielectric area 13 (dielectric insulation of hollow regions 14 and 15) completely oxidizes also this silicon portion 24.

In this case, the formation of the insulation well 16 requires a precise calibration of the etching process (both dry and in acid solution) and it is quite critical from a manufacturing point of view since the silicon portion 24 must not be excessively wide so as to be completely oxidized, and not too thin (or even void) so as to be able to mechanically support the insulation well 16. The oxidation of the silicon portion 24 of the support structure 23 causes also the overhanging insulation well 16 to be increased, thus negatively affecting the surface planarity of the structure 10.

SUMMARY OF THE INVENTION

The technical problem underlying the present invention is to provide an integrated structure that effectively forms a dielectrically insulated well for integrating electronic devices, and one that has structural and functional characteristics that overcome the limits and drawbacks still affecting prior art structures.

In accordance with the present invention, a dielectric trench structure for an insulation well is equipped with a plurality of side support regions that ensures the correct support to the insulation well without requiring additional complicated process steps.

Based on this approach, a dielectric insulation structure is formed in a silicon layer by integrating a dielectric trench structure that defines an insulation well. Semiconductor devices are integrated in the insulation well. A hollow region is under the insulation well and is completely surrounded by a dielectric area. The dielectric area is also on the walls of the dielectric trench structure to serve as side insulation thereof. The dielectric trench structure is also interrupted in a plurality of points to define a plurality of side support regions for the insulation well.

Another aspect of the present invention is to provide a manufacturing process for a dielectric insulation structure that is formed in a silicon layer. The method comprises forming a dielectric trench structure in the silicon layer, covering the walls of the dielectric trench structure with a dielectric protection material, and forming a hollow region underlying the dielectric trench structure.

The method may further comprise an oxidizing step for forming a dielectric area and to dielectrically insulate the hollow region, thus forming an insulation well for integrating electronic devices therein. A slightly conductive material may be deposited in the dielectric trench structure to fill it.

The surface of the dielectric insulation structure may also be planarized. The method is characterized in that the manufacturing step of the dielectric trench structure also comprises a phototechnique and photoetching step of the dielectric trench structure to define a plurality of side support regions of said insulation well.

BRIEF DESCRIPTION OF THE DRAWINGS

The features and advantages of the dielectric insulation structure and related manufacturing process according to the invention will be apparent from the following description of an embodiment thereof given by way of a non-limiting example with reference to the attached drawings, in which:

FIGS. 4A and 4B are electronic photographs of alternative embodiments of the structure of FIG. 3A;

FIG. 5A schematically shows a layout of an electronic component integrated in a dielectric insulation structure according to the present invention.

DETAILED DESCRIPTION OF THE PREFERRED EMBODIMENTS

Figure 1:
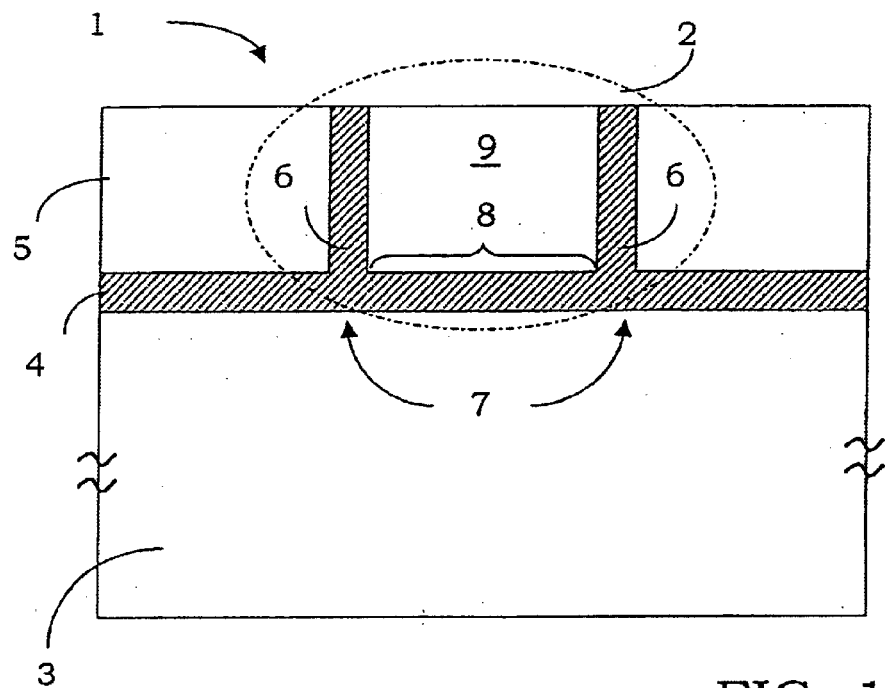
FIG. 1 schematically shows an integrated structure used for forming a dielectrically insulated well according to the prior art.
Figure 2A:
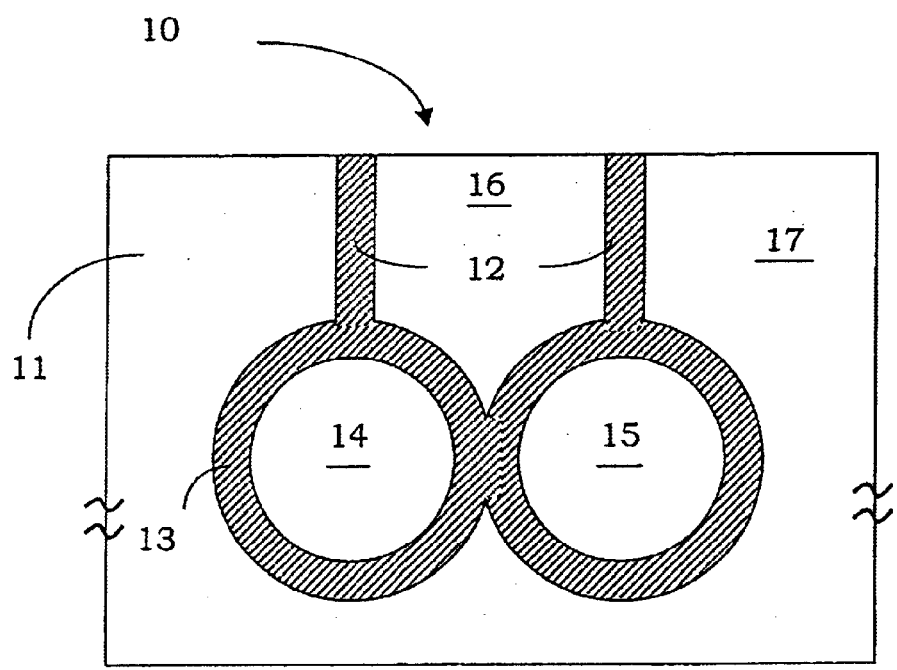
FIG. 2A schematically shows a further integrated structure for forming a dielectrically insulated well according to the prior art.
Figure 2B:
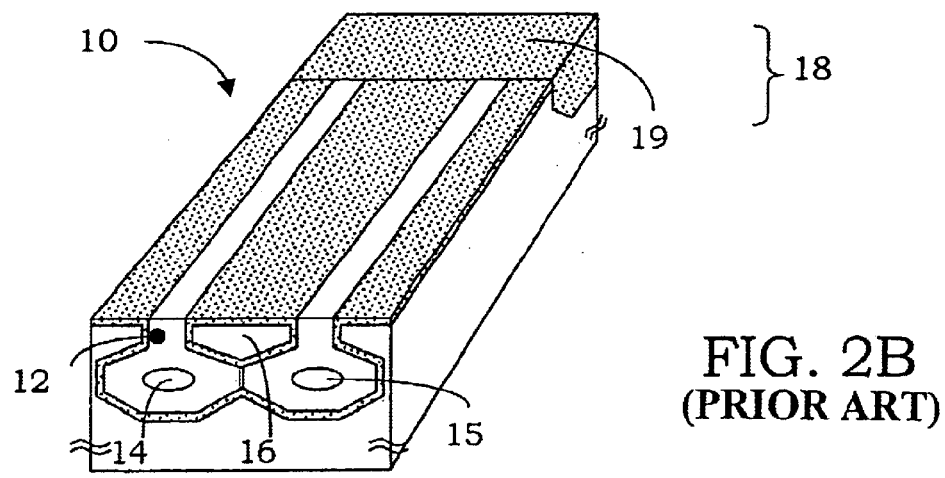
FIGS. 2B to 2D schematically show alternative embodiments of the structure of FIG. 2A.
Figure 2C:
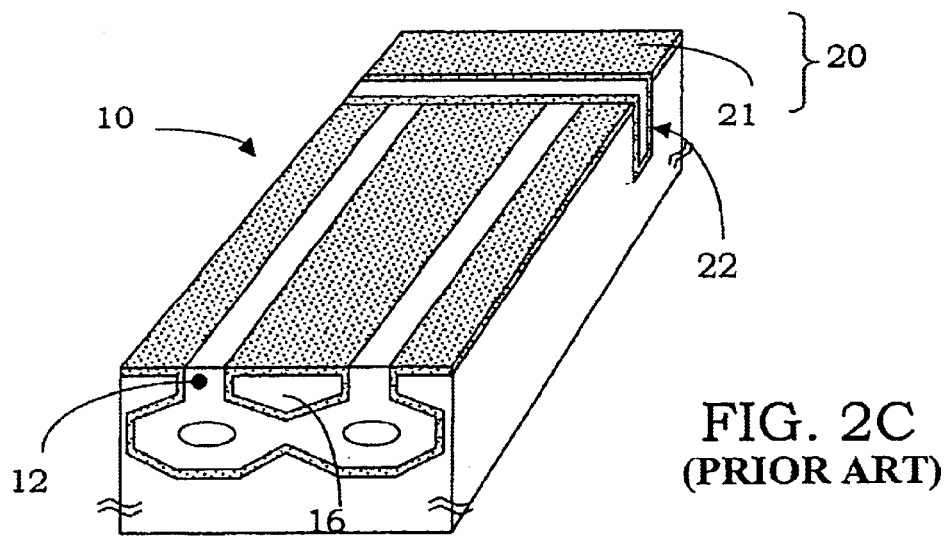
Figure 2D:
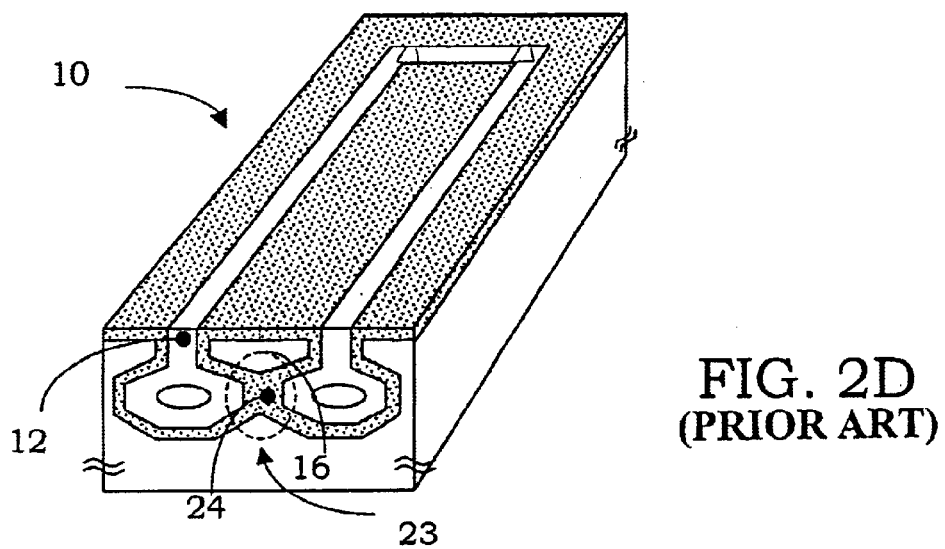
Figure 3A:
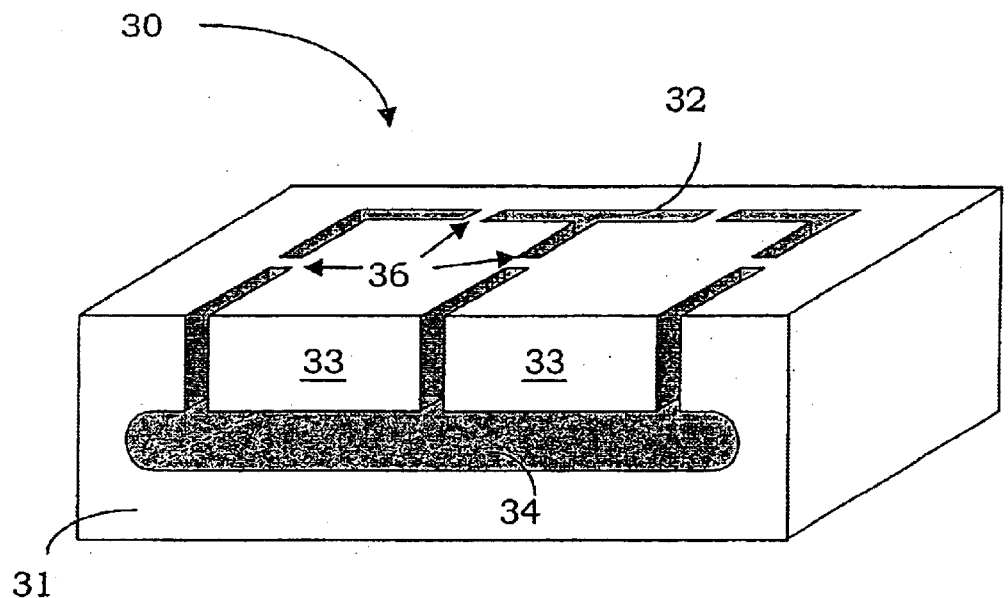
FIGS. 3A and 3B schematically show different process steps for a dielectric insulation structure according to the present invention.
Figure 3B:
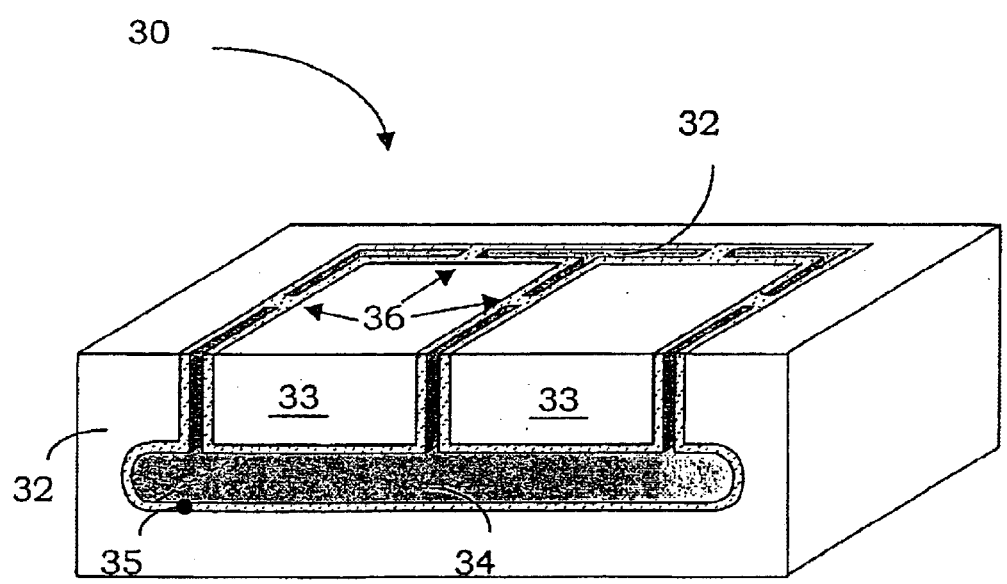

With reference to the drawings, and particularly to FIGS. 3A and 3B, a dielectric insulation structure according to the present invention is globally and schematically indicated with reference numeral 30. The cross-sections shown in the drawings are not drawn to scale, but nonetheless show the important features of the structure according to the present invention.

Reference will be made to process steps that do not form a complete process flow for manufacturing integrated circuits. The present invention can be implemented by using the integrated circuit manufacturing techniques presently used in the field, but the process steps which are necessary to understand the present invention are only included herein.

The dielectric insulation structure 30 is formed in a silicon layer 31 by integrating a dielectric trench structure 32 that defines an insulation well 33. The insulation well 33 is for integrating semiconductor devices therein. In particular, the dielectric insulation structure 30 includes a hollow region 34 underlying the insulation well 33, and is completely surrounded by a dielectric area 35 The dielectric area is also in the dielectric trenches 32 for forming the side insulation thereof. The presence of the single hollow region 34 below the insulation well 33 allows the introduction of a bulk region for supporting the device to be integrated in the well 33.

The dielectric trench structure 32 is advantageously equipped with side support regions 36 for the insulation well 33. These side support regions 36 of the insulation well 33 are formed through a phototechnique and photoetching step of the dielectric trenches for delimiting the insulation well 33.

The number of side support regions 36 is a function of the overall dimensions of the integrated device to be formed, and thus of the insulation well 33. A higher number of side support regions 36 are necessary to support an insulation well 33 where large size electronic devices are integrated. Moreover, these side support regions 36 are conveniently chosen with a thickness of essentially 1 μm to ensure a correct oxidation thereof.

In particular, the dielectric insulation structure 30 according to the invention is formed through a process comprising a manufacturing step of forming the dielectric trench structure 32 by a dry anisotropic etching of the silicon layer 31, covering the walls of the dielectric trenches 32 by a dielectric protection material, and a manufacturing step of forming the hollow region 34 by etching the silicon layer 31 underlying the dielectric trench structure 32. In particular, this etching can be dry or in acid solution. The dielectric protection material covering the walls of the structure 32 trenches is chosen to be selective to the etching of the silicon layer 31 to form the hollow region 34.

The process further comprises an oxidizing step to form the dielectric area 35 and to dielectrically insulate the hollow region 34, thus forming the insulation well 33, and depositing a not very conductive material for allowing dielectric trenches of the structure 32 to be filled, and accordingly, as function of the trench depth, the hollow region 34 may also be partially filled. The dielectric insulation structure 30 surface is then planarized.

According to the invention, the manufacturing step of the dielectric trench structure 32 of the dielectric insulation structure 30 also comprises a phototechnique and photo-etching step for delimiting the insulation well 33 by defining side support regions 36. The side support regions 36 are completely oxidized during the oxidation step to form the dielectric area 35.

The depth of side support regions 36 is advantageously chosen to ensure a complete dielectric insulation towards the insulation well 33. In particular, the depth required for these side support regions 36 can be obtained with a high precision level since they are defined through masking during the anisotropic etching step to form structure 32 dielectric trenches, and thus with a high controllability and repeatability level.

It is worth noting that, differently from the structure 10 described with reference to the prior art, the etching step (dry or wet) to form the hollow region 34 is not critical for the mechanical support of the insulation well 33, since this etching step must form a single cavity intended as the union of adjacent well cavities. This etching step thus requires a lower degree of controllability, and as already said, it is not critical for the formation of the hollow region 34.

Moreover, the manufacturing of the structure is advantageously equipped with side support regions 36 to ensure a complete dielectric insulation of the insulation well 33. The side support regions 36 do not require additional steps as seen with reference to the prior art structure 10. In particular, the insulation well 33 is defined with the same masking level used to define structure 32 dielectric trenches, thus allowing also a certain versatility in the integration of adjacent insulation wells having a different size.

In fact, as a function of the overall area which the insulation well 3 is to have, the dielectric trench structure 32 forming the perimeter thereof can be interrupted in several points for producing several side support regions 36 for the insulation well 33, as shown by the electron microscope photographs of FIGS. 4A and 4B. These figures illustrate the surface of the structure 30 according to the invention, which comprises a different number of side support regions 36.

The dielectric insulation structure 30 thus allows an electronic device to be integrated in the insulation well 33. FIG. 5A schematically shows the layout of an NPN bipolar device integrated in an insulation well 33 according to the invention, with side support regions 36. This schematic view from above corresponds to the structure shown in the photograph of FIG. 3B.

Figure 5B:
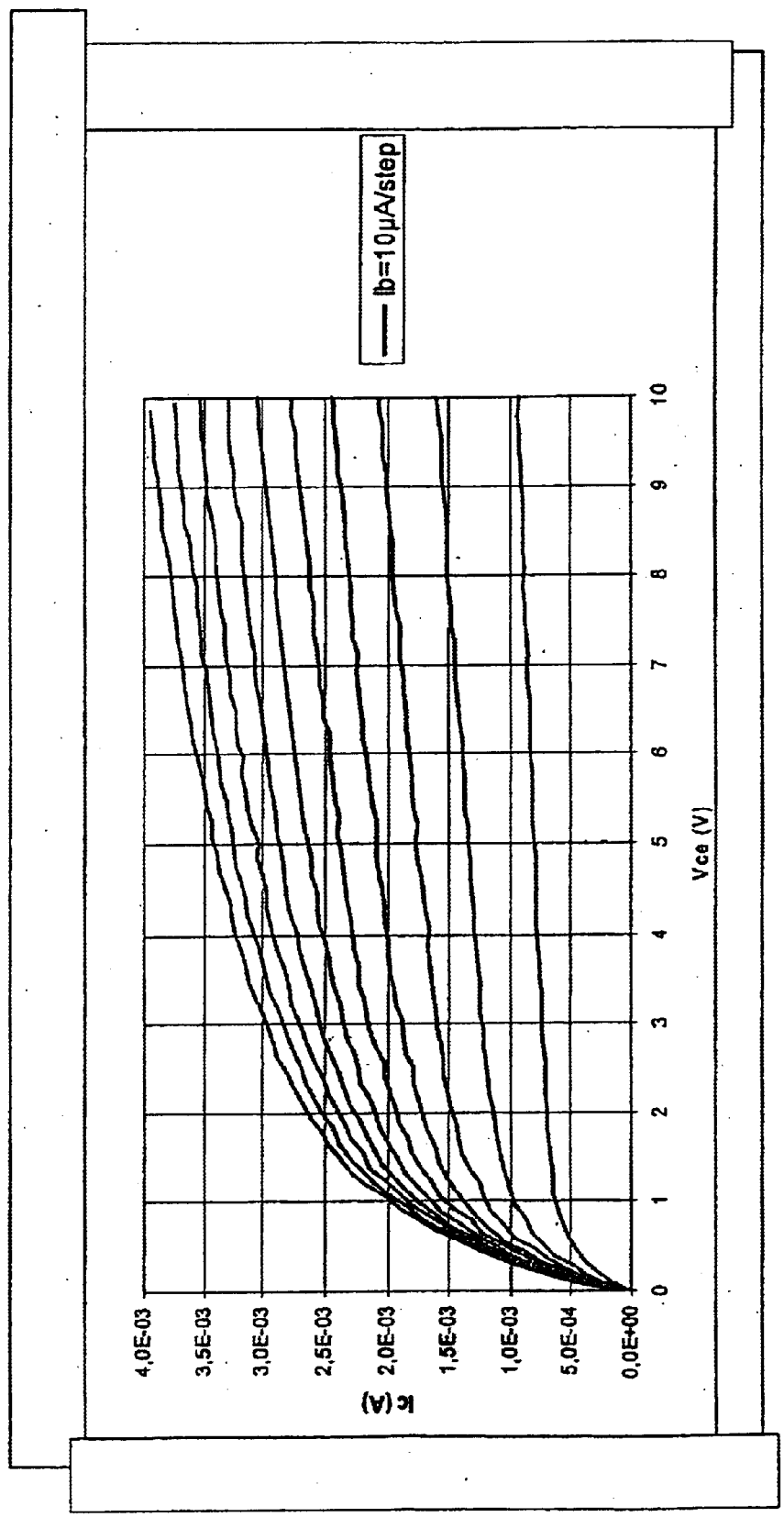
FIG. 5B shows an experimentally drawn trend of output features of the electronic component of FIG. 5A.

The electric features of this NPN device integrated in the insulation well 33 according to the invention have been experimentally drawn by the Applicant and they are shown in FIG. 5B. In conclusion, the dielectric insulation structure 30 advantageously keeps the fundamental features required for the dielectric wells. These fundamental features may also be obtained, for example, by the prior art structure 10, particularly the following: a complete dielectric insulation; the vertical conduction silicon region formation to integrate power devices on the same chip; and at a low production cost. The dielectric insulation structure 30 allows the problems pointed out with reference to the prior art structures to be overcome.

Moreover, the dielectric insulation structure 30 according to the invention allows dielectrically insulated circuits for any type of application to be integrated, including the driving circuitry of power devices such as, for example, VIPower, IGBT and Smart Power. For these last device classes, the dielectric insulation structure 30 according to the present invention is particularly advantageous. The manufacturing process of the dielectric insulation structure 30 has a low production cost, comprises the traditional process steps for manufacturing integrated devices, and does not require the addition of supplementary process steps.

That which is claimed is:

1. A dielectric insulation structure comprising:
   a semiconductor substrate;
   a dielectric trench structure in said semiconductor substrate for defining at least one insulation well where semiconductor devices are to be formed therein;
   said semiconductor substrate having a hollow region underlying said dielectric trench structure, the hollow region also having a dielectric layer on interior surfaces thereof; and
   said dielectric trench structure comprising a dielectric layer therein, said dielectric trench structure also being interrupted by a plurality of regions in said semiconductor substrate to define a plurality of side supports for said at least one insulation well, with each respective sidewall of said at least one insulation well having a side support associated therewith.

2. A dielectric insulation structure according to claim 1, wherein said semiconductor substrate comprises silicon.

3. A dielectric insulation structure according to claim 1, wherein said plurality of side supports are formed based upon photolithography.

4. A dielectric insulation structure according to claim 1, wherein said plurality of side supports are sized so that said at least one insulation well is substantially insulated by said dielectric trench structure.

5. A dielectric insulation structure according to claim 1, wherein said plurality of side supports are sized to permit oxidation.

6. A dielectric insulation structure according to claim 5, wherein said plurality of side supports are sized using a masking step during an anisotropic etching when said dielectric trench structure is formed.

7. A dielectric insulation structure according to claim 1, wherein a quantity of said plurality of side supports is a function of overall dimensions of said at least one insulation well.

8. An integrated circuit comprising:
   a semiconductor substrate;

a dielectric trench structure in said semiconductor substrate for defining at least one insulation well;

said semiconductor substrate having a hollow region underlying said dielectric trench structure, the hollow region also having a dielectric layer on interior surfaces thereof;

said dielectric trench structure comprising a dielectric layer therein, said dielectric trench structure also being interrupted by a plurality of regions in said semiconductor substrate to define a plurality of side supports for said at least one insulation well, with each respective sidewall of said at least one insulation well having a side support associated therewith and at least one semiconductor device formed in said at least one insulation well.

9. An integrated circuit according to claim 8, wherein said semiconductor substrate comprises silicon.

10. An integrated circuit according to claim 8, wherein said plurality of side supports are formed based upon photolithography.

11. An integrated circuit according to claim 8, wherein said plurality of side supports are sized so that said at least one insulation well is substantially insulated by said dielectric trench structure.

12. An integrated circuit according to claim 8, wherein said plurality of side supports are sized to permit oxidation.

13. An integrated circuit according to claim 12, wherein said plurality of side supports are sized using a masking step during an anisotropic etching when said dielectric trench structure is formed.

14. An integrated circuit according to claim 8, wherein a quantity of said plurality of side supports is a function of overall dimensions of said at least one insulation well.

* * * * *